SOLDERABLE BACKSIDE OHMIC CONTACT METAL SYSTEM FOR SEMICONDUCTOR DEVICES AND FABRICATION PROCESS THEREFOR

Filed Jan. 13, 1967 2 Sheets-Sheet 1

INVENTORS
PAUL P. CASTRUCCI
ROBERT H. COLLINS
ROBERT G. SHEPHEARD

BY Harry M Weiss
ATTORNEY 3,480,841

SOLDERABLE BACKSIDE OHMIC CONTACT METAL SYSTEM FOR SEMICONDUCTOR DEVICES AND FABRICATION PROCESS THEREFOR

Paul P. Castrucci and Robert H. Collins, Poughkeepsie, and Robert G. Shepheard, Fishkill, N.Y., assignors to International Business Machines Corporation, Armonk, N.Y., a corporation of New York Filed Jan. 13, 1967, Ser. No. 609,071
Int. Cl. H01l 3/00, 5/00
U.S. Cl. 317—234 25 Claims

ABSTRACT OF THE DISCLOSURE

This is an improved solderable backside contact system for providing both a strong mechanical connection between a semiconductor device and a substrate as well as a good ohmic electrical contact to the semiconductor device. The contact system comprises either a two metal film or a three metal film composite structure. The ohmic contact metal for either the two or three metal layer composite structure is selected from the class of metals consisting of Cr, Al, and Ti. The solderable metal film in contact with the ohmic contact metal is selected from one of the class consisting of Cu, CrCu, Ni, and Ag. For the three metal layer, the oxide barrier metal film, in contact with the solderable metal layer, is Au.

BACKGROUND OF THE INVENTION

Field of the invention

This invention relates generally to a solderable backside ohmic contact metal system for semiconductor devices and the fabrication process therefor and, more particularly, to a solderable backside ohmic contact metal system for high power silicon semiconductor devices mounted on a metal land located on an insulating substrate whereby both good electrical ohmic contact and strong mechanical adhesion is achieved between the semiconductor device and the conductive metal land on the substrate surface.

Description of the prior art

In the past, various ohmic contact metals have been used to make good electrical contact to either N or P type regions of a semiconductor device. However, some ohmic contact materials were of an inherently P or N conductivity type and hence, could not be readily used to make ohmic contact to both N and P type regions of a semiconductor device without forming a rectifying contact where the semiconductor region was of opposite type conductivity from the conductivity of the selected metal contact. Accordingly, careful selection dictated the use of an ohmic contact material that could be applied to both N and P type regions of a semiconductor device.

In the selection of an ohmic contact metal that could be used both for making a good ohmic contact to both P and N type regions of a semiconductor device and also serve to permit a strong mechanical connection to be made between the backside of the semiconductor device and a conductive land formed on an insulating substrate, it became substantially more difficult to find a suitable metal contact system that could provide both functions. Furthermore, it was additionally desirable to have a metal contact scheme for the backside portion of a semiconductor device which would also permit rapid connection to be made between the semiconductor device and the conductive land portion of the insulating substrate at low temperatures to prevent deleterious effects to the insulators or to the semiconductor regions that might be caused by, for example, movement of the impurities or the carrier lifetime killing materials like gold.

Solderable metal contact systems have been used to connect a frontside surface portion of a semiconductor device to a conductive land portion located on an insulating surface. However, the use of this type of frontside solderable metal contact system could not be readily adapted for use in providing a backside solderable metal contact over the entire bottom surface portion of a high powered semiconductor device. The backside solderable contact system had to permit large amounts of current to be conducted therethrough with minimum electrical resistance and, in addition, had to provide a strong mechanical bond or connection between the semiconductor device and the conductive land located on the insulating substrate.

Another consideration associated with making a good solderable backside metal contact to a semiconductor device was that the solderable material had to wet and adhere very well to both the semiconductor device or chip and the conductive land portion located on the insulating substrate. In many solder contact schemes, it was difficult to effect adherence between the semiconductor chip and a conductive land portion of an insulating substrate due to the fact that the solder metal would usually adhere to and wet either the semiconductor chip or the conductive land portion on the insulating substrate, but not both.

Accordingly, it is an object of this invention to provide an improved solderable, backside, ohmic contact, metal system for interconnecting a semiconductor chip to a conductive land.

It is another object of this invention to provide a method for fabricating a solderable, backside, metal contact system in accordance with this invention.

It is still a further object of this invention to provide an improved solderable, backside, ohmic contact, metal system for use in connecting a silicon semiconductor device to a conductive land portion located on an insulating substrate.

SUMMARY OF THE INVENTION

In accordance with one embodiment of this invention, a method is described for forming a backside solderable ohmic metal contact to a semiconductor device. This method comprises the steps of forming a semiconductor device and a low resistance semiconductor region having an impurity concentration of at least $10^{18}$ cm.$^{-3}$ on the backside portion of the semiconductor device. Preferably, the low resistance semiconductor region is of the same resistance as an emitter diffused region approximately $10^{20}$ cm.$^{-3}$ or greater. An ohmic contact metal selected from a class of metals consisting of chromium, aluminum and titanium is applied to the backside low resistance semiconductor region. A solderable metal film selected from the class consisting of copper, chrome-copper, nickel, and silver is applied in contact with the ohmic contact metal. Preferably, the ohmic contact metal is chromium, the solderable metal film is copper, and an oxide barrier gold layer is applied to the copper film.

In accordance with another embodiment of this invention, a semiconductor device arrangement is provided which comprises a semiconductor device having a low resistance semiconductor region located on the backside of the device. A solderable ohmic metal contact system is located on the backside low resistance semiconductor region. The solderable ohmic metal contact system comprises an ohmic contact metal selected from the class of metals consisting of chromium, aluminum and titanium which is located on the backside low resistance semiconductor region. In addition, the solderable ohmic metal contact system comprises the solderable metal film selected from the class consisting of copper, chrome-copper, nickel and silver which film is located on the selected ohmic contact metal. In addition, in order to prevent oxide corrosion, an oxide barrier gold layer is located on the solderable metal film.

In accordance with still another embodiment of the invention, a module is provided with the above described semiconductor device arrangement backside mounted on a solder coated conductive land located on an insulating substrate. Connectors are located between the conductive lands and terminal contacts located on the frontside of the semiconductor device. The terminal contacts are in electrical contact with the semiconductor regions of the device.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
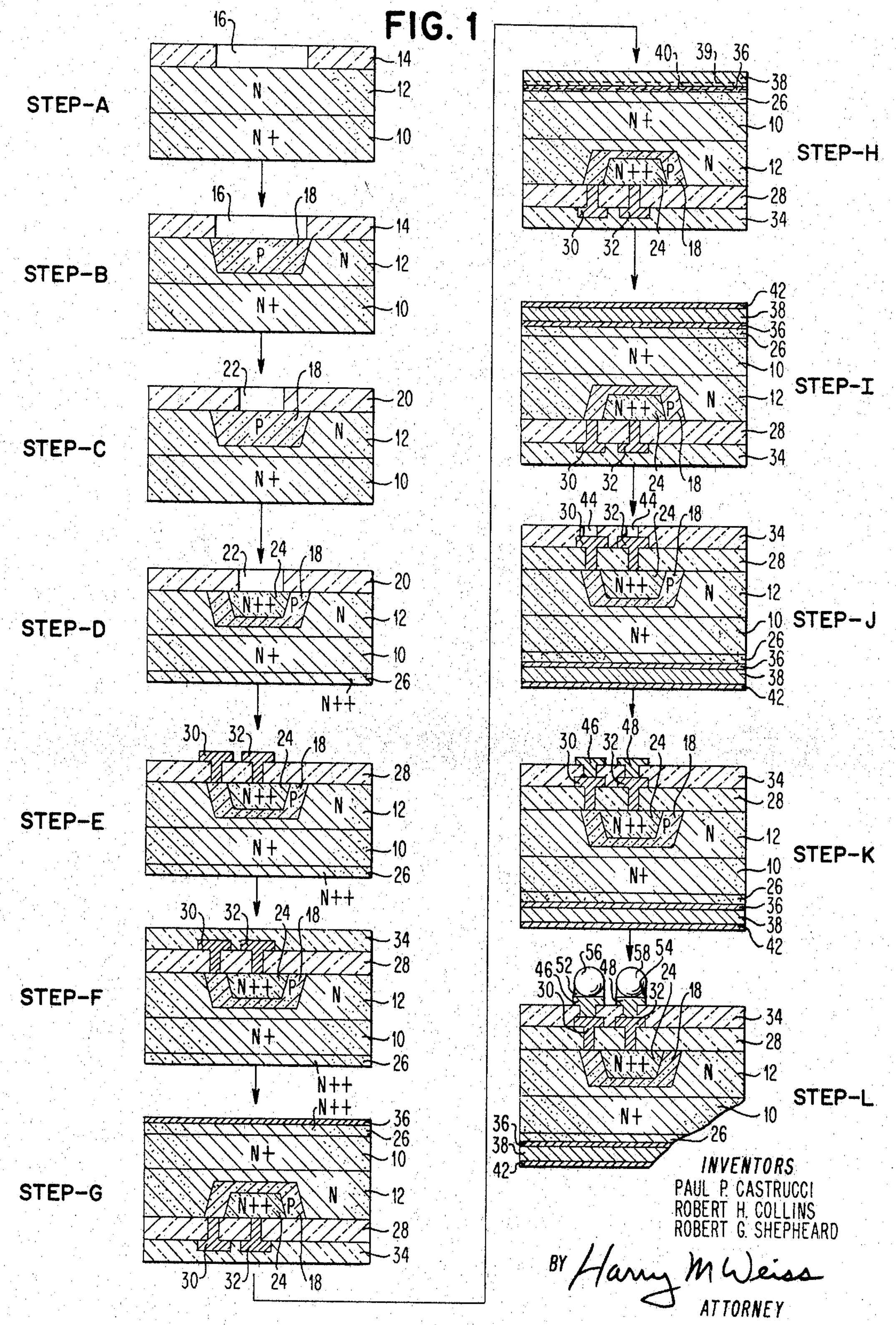
FIG. 1 is a flow diagram, in cross-section, showing the steps in fabricating a semiconductor device or chip with a three metal film solderable, backside contact system.

Referring to FIG. 1, step A depicts an $N^+$ substrate 10 on which is epitaxially grown an N-type layer 12. For example, the substrate material is 0.012±0.003 ohm-cm. antimony-doped, eight mils thick silicon. The epitaxial layer is phosphorus doped silicon and is 8.0±0.5 microns thick, as measured by infrared interference techniques. The epitaxial resistivity of layer 12 is 7±1 ohm-cm.

An oxide layer 14 is preferably thermally grown on the surface of the N-type epitaxial layer 12, by initially loading the epitaxially grown substrate structure into a slotted quartz holder that is placed in a 1050° C. furnace and oxidized 10 minutes in dry $O_2$ and 60 minutes in steam. The resultant oxide thickness of layer 14 is about 5300 angstroms thick. If desired, the oxide or insulating layer 14 can be deposited or R.F. sputtered onto the semiconductor surface. Other insulating materials such as alumina or silicon nitride etc. can be used, if desired.

By using standard photolithographic masking and etching techniques, an opening 16 is formed in the $SiO_2$ layer 14 using buffered HF as the etching solution.

In step B, a P-type diffused base region 18 is formed in the epitaxial (collector) layer 12 using, for example, boron impurities. This base diffusion operation leaves a diffused region having a $C_0$ of about $8\times10^{18}$ cm.$^{-3}$.

In step C, a regrown oxide layer 20 is formed on the semiconductor surface and by photolithographic masking and etching techniques, an opening 22 is formed in the oxide layer 20. The opening 22 is located above the P-type diffused base region 18.

In step D, an $N^{++}$ type diffused emitter region 24 is formed in the P-type base region 16 by diffusing, for example, phosphorous impurities through opening 22 into the P-type region 16. Since the backside of the $N^+$ semiconductor substrate 10 is bare, the phosphorous diffusion operation forms a planar $N^{++}$ diffused region 26. The impurity concentration of the emitter region 24 or the planar diffused region 26 is about $5\times10^{20}$ cm.$^{-3}$.

In step E, an oxide layer 28 is regrown on the semiconductor surface and, by photolithographic masking and etching techniques, openings are formed in the oxide layer 28 above the base 18 and emitter 24 regions. Ohmic contacts 30 and 32 are respectively made to the base 18 and emitter 24 regions of the transistor device by metal deposition and substractive metal removal techniques using, for example, aluminum. Preferably, 1500 angstrom units of aluminum are evaporated onto the semiconductor structure at a surface temperature of 200° C. and 4500 more angstrom units of aluminum are evaporated onto the semiconductor structure at a surface temperature of 60° C. or less. Chamber pressure is preferably about $5\times10^{-6}$ torr. The aluminum contacts are subtractively etched using a warm solution of $H_3PO_4+HNO_3+H_2O$.

The semiconductor structure is sintered in a nitrogen atmosphere at 440° C. for 15 minutes to produce good ohmic contacts.

In step F, an insulating layer 34 is deposited on the top side of the structure to protect the aluminum land pattern from corrosion. Preferably, two coats of glass are applied to make up the insulating layer 34. The first coat is fired for 11 minutes and the second is fired for 12 minutes. Firing temperature for both coats is 565° C. Total thickness is preferably 1.5 microns. U.S. Patent 3,212,921 assigned to the assignee of this invention describes one process for depositing the insulating layer 34. R.F. sputtering techniques can be used to deposit the insulating layer 34.

In step G, the structure is reversed or flipped over and then loaded into an evaporator which is subsequently evacuated to a pressure of $10^{-5}$ torr. A film 36 of 1500 angstroms ±200 angstroms of Cr is deposited on the backside of the structure. The temperature of the wafer during chromium deposition should be in the range of 200°–250° C. This provides good ohmic contact to the $N^{++}$ back surface region 26.

In step H, a film 38 of 5000 angstroms ±500 angstroms of Cu is deposited onto the Cr film 36. The chromium and copper evaporation operations are overlapped, as shown by phantom lines 39 and 40, in order to provide a stronger bond between the layers 36 and 38. Deposition temperature is 200±10° C.

In step I, a metal film 42 of about 2800 angstrom units of Au is deposited onto the metal layer 38. This completes the three metal film backside contact system. Metal layer 36 provides ohmic contact to the device, metal layer 38 provides a solderable film, and metal layer 42 provides an oxide barrier film.

In step J, the structure is again reversed or flipped over to permit further processing. Holes 44 are formed in the glass layer 34 by, for example, using an HF-$HNO_3$ solution following a photolithographic masking operation.

In step K, the structure is mounted on a holder in an evaporator and metal land masks are aligned with the terminal holes 44. The evaporator is evacuated to a pressure of $<10^{-5}$ torr. The chamber is backfilled to approximately $30\times10^{-3}$ torr and DC sputter cleaned for 15 minutes. The chamber is then re-evacuated to $<10^{-5}$ torr, and 1500 angstroms ±200 angstroms of Cr are evaporated, followed by 5000 angstroms ±500 angstroms of Cu, and 1400 angstroms ±200 angstroms of Au to provide limiting lands 46 and 48, respectively, in electrical contact with ohmic contacts 30 and 32. The chromium and copper evaporations are preferably overlapped. The structure surface temperature must be greater than 150° C. before the chromium is evaporated.

In step L, the structure is mounted in a Pb-Sn evaporator evacuated to $10^{-5}$ torr. Then 1.7±0.2 mils of 95%–5% of Pb-Sn is evaporated onto the structure through the holes in a mask to form terminal solder pad regions 52 and 54, respectively, in contact with limiting lands 46 and 48.

A balling mask is next aligned with the Pb-Sn pads. Two 5 mil diameter nickel-plated copper balls 56 and 58 are placed in the holes of the mask, and the assembly is heated on a hot stage in a nitrogen atmosphere to 370° C. The Pb-Sn solder at this temperature fuses, attaching each ball to its respective pad. In this manner, terminal contacts are made to the base and emitter regions of the device with the backside contact made to the collector.

TABLE I.—CROSS-SECTIONAL DIMENSION OF THE DEVICE FORMED IN FIG. 1

| Parameters: | | Value |
|---|---|---|
| Collector depth | mils | 0.100±0.003 |
| Emitter depth | do | 0.065±0.002 |
| Base width | do | 0.045±0.004 |
| Boron $\rho_s$ | ohm/□ | 150±15 |
| Phosphorus $\rho_s$ | ohm/□ | 6±0.5 |
| Oxide thickness: | | |
| E–B junction | angstroms | 5760 |
| C–B junction | do | 7820 |

Figure 2:
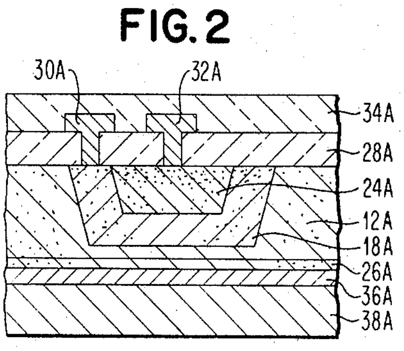
FIG. 2 illustrates, in cross-section, a two metal film, solderable, backside contact system for a transistor device.

Referring to FIG. 2, a transistor device is shown, in cross-section, having only a two metal film backside contact system. Reference numerals used in FIG. 1, with the addition of the letter A, are repeated in FIG. 2 to identify the same regions or features. Hence, emitter 24A, base 18A, and collector 12A either NPN or PNP comprise the transistor device of FIG. 2. No oxide barrier film is used on the solderable metal film 38A.

Figure 2A:
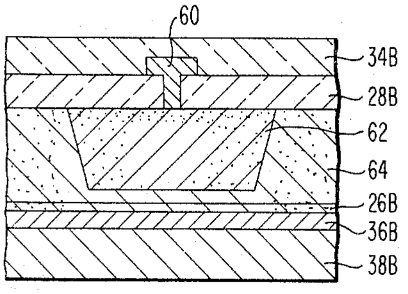
FIG. 2A illustrates, in cross-section, a two metal film, solderable, backside contact system for a diode device.

Referring to FIG. 2A, a diode device is shown, in cross-section, having a two metal film backside contact system. Reference numerals used in FIG. 1, with the addition of the letter B, are repeated in FIG. 2 to identify the same regions or features. Ohmic contact 60 is provided for the diffused region 62 which is of one type conductivity and backside ohmic contact 36B is provided for region 64 which is of the opposite type conductivity. It is readily apparent that various semiconductor devices can be made and utilized in accordance with the principles of this invention.

The following table identifies various backside ohmic metal contact systems that can be used:

TABLE II.—BACKSIDE METAL SYSTEMS

| A. Ohmic contact metal for adhesion to N+ or P+ semiconductor surface | B. Solderable metal film in contact with ohmic contact metal | C. Oxide barrier metal film in contact with solderable metal film |
|---|---|---|
| Cr | Cu | Au |
| Cr | Cu | |
| Al | (Cr-Cu) | Au |
| Al | (Cr-Cu) | |
| Ti | Cu | Au |
| Ti | Cu | |
| Cr | Ni | Au |
| Cr | Ni | |
| Ti | Ni | Au |
| Ti | Ni | |
| Al | Ni | Au |
| Al | Ni | |
| Cr | Ag | |

Column A and B metal films could be used for two metal systems as illustrated by FIGS. 2 and 2A. For three metal film systems, the metals identified in columns A, B, and C could be used.

Figure 3:
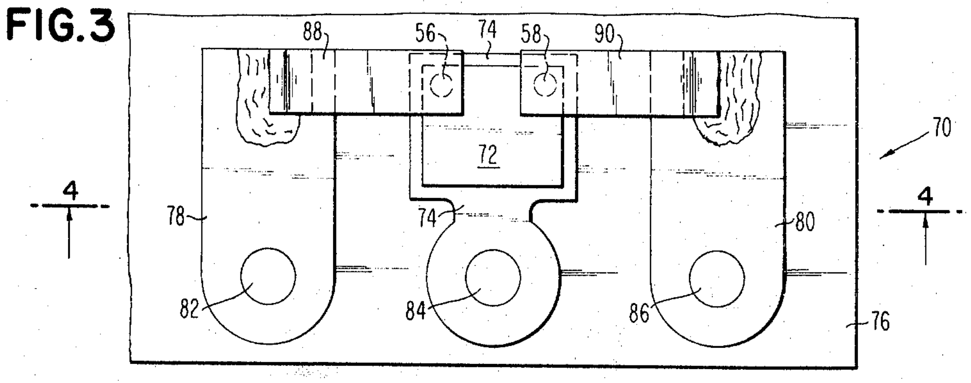
FIG. 3 is a top view of a corner of a module showing a semiconductor chip backside mounted on a center conductive land with electrical contact shown between the outside conductive lands and the chip.

Referring to FIG. 3, a top view is shown of a corner of a module generally designated by reference numeral 70. A semiconductor chip 72 is shown backside mounted on a conductive land 74 which is, preferably, printed on surface 76 of the module 70. Conductive lands 78 and 80 are likewise formed on surface 76 of module 70 and pins 82, 84, and 86 are in electrical contact, respectively, with conductive lands 78, 74, and 80. Pins 82, 84, and 86 are mounted in through holes (not shown) in the module 70 which is preferably composed of an insulating material like alumina. In this manner, electrical contact can be made between a pin loaded or mounted module and a printed circuit "mother" card containing holes for the pins of a number of modules. Each conductive land 74, 78 and 80 is preferably a silver (80%)-palladium (20%) alloy. A lead (90%)-tin (10%) solder is applied to the surface of each land.

Figure 4:
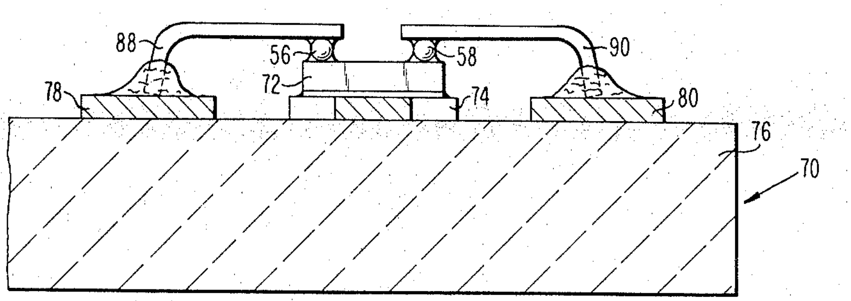
FIG. 4 is a sectional view taken on line 4—4 of FIG. 3.

Referring to FIG. 4, which is a sectional view taken on line 4—4 of FIG. 3, nickel-plated copper straps 88 and 90 are shown mounted in electrical contact, respectively, with the base and emitter regions of the transistor by virtue of being in electrical contact with terminal balls 56 and 58. In the connection process, by virtue of the solder coating on each land, the chip 72 and the straps 88 and 90 are respectively connected to the lands 74, 78, and 80 during one heating step at 370° C. in a nitrogen atmosphere. Similarly, by placing lead-tin solder on the ends of the straps 88 and 90, connection is made between these straps and terminal balls 56 and 58 during the same chip and strap connection heating step.

Figure 5:
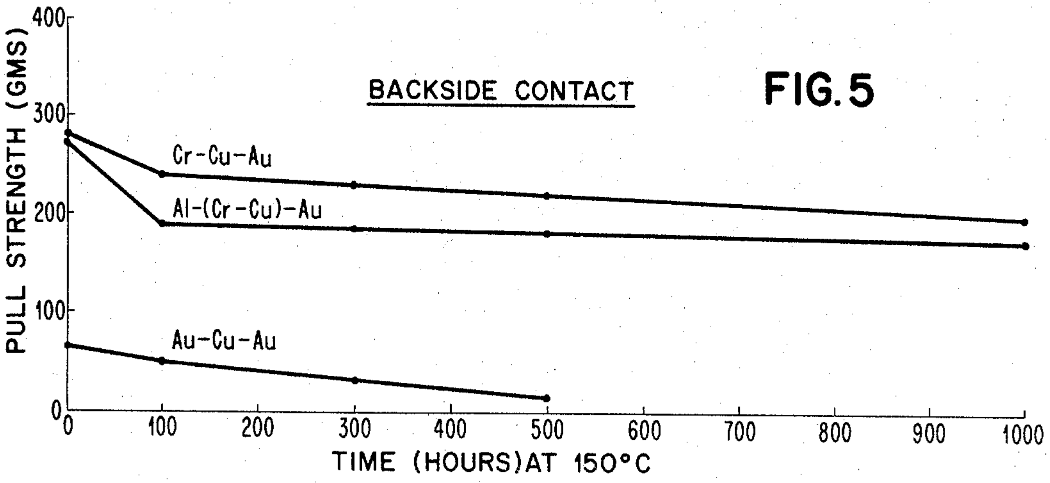
FIG. 5 is a graph indicating the strength of the three metal film, solderable, backside contact system of this invention.

Referring to FIG. 5, a graph is shown illustrating the advantages of two of the backside contact metal systems identified in Table II. A typical Au-Cu-Au backside contact metal system is not very good in comparison with either the Al-(Cr-Cu)-Au or the Cr-Cu-Au backside contact metal systems. The Cr-Cu-Au system is the superior system in that it could withstand a pull strength of about 250 grams over a thousand hour period.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for forming a blackside, solderable, ohmic metal contact to a semiconductor device comprising the steps of:

- forming a semiconductor device and a low resistance semiconductor region having an impurity concentration of at least $10^{18}$ cm. $^{-3}$ on the backside portion of the semiconductor device;
- applying an ohmic contact metal selected from the class of metals consisting of chromium, aluminum, and titanium to the backside low resistance semiconductor region; and
- applying a solderable metal film selected from the class consisting of copper, chrome-copper, nickel and silver in contact with the ohmic contact metal.

2. A method in accordance with claim 1, including the step of applying a gold layer in contact with said selected solderable metal film.

3. A method in accordance with claim 1, wherein said solderable metal film being evaporated onto said ohmic contact metal during evaporation of said ohmic contact metal.

4. A method in accordance with claim 3, wherein said ohmic contact metal being chromium and said solderable metal film being copper.

5. A method in accordance with claim 3, wherein said ohmic contact metal being aluminum and said solderable metal film being composed of layers of chromium and copper.

6. A method in accordance with claim 4, including the step of applying a gold layer in contact with said copper film.

7. A method in accordance with claim 5, including the step of applying a gold layer in contact with said copper layer.

8. A method for forming a backside, solderable, ohmic metal contact to a silicon semiconductor device comprising the steps of:

epitaxially growing a monocrystalline silicon layer of one type conductivity onto a low resistance silicon substrate of the same conductivity type;

forming at least one diffused region in said epitaxially grown layer to form a semiconductor device;

forming a diffused low resistance region of the same conductivity type as said substrate on the backside of said low resistance substrate;

applying ohmic contacts to the surface of said epitaxial layer including said at least one diffused region;

evaporating an ohmic contact metal selected from the class of metals consisting of chromium, aluminum, and titanium onto said diffused low resistance region on the backside of said low resistance substrate; and evaporating during a portion of said ohmic contact metal evaporation step a solderable metal film selected from the class consisting of copper, chrome-copper, nickel, and silver.

9. A method in accordance with claim 8, including the step of evaporating a gold layer onto said solderable metal film.

10. A method in accordance with claim 9, wherein said ohmic contact metal being chromium and said solderable metal film being copper.

11. A method in accordance with claim 9, wherein said ohmic contact metal being aluminum and said solderable metal being composed of phased-in evaporated layers of chromium and copper.

12. A method in accordance with claim 8, wherein said diffused low resistance region formed on the backside of said low resistance substrate being formed during the step of forming a semiconductor device in said epitaxial layer.

13. A method in accordance with claim 8, including the steps of depositing a protective insulating layer over the ohmic contacts to the surface of said epitaxial layer including said at least one diffused region; and applying terminal contacts onto the surface of said protective insulating layer and through said insulating layer into electrical contact with said ohmic contacts.

14. A semiconductor device arrangement comprising, in combination, a semiconductor device having a low resistance semiconductor region having an impurity concentration of at least $10^{18}$ cm.$^{-3}$ located on the backside of the device; and a solderable, ohmic metal contact system located on said backside low resistance semiconductor region, said solderable, ohmic metal contact system comprising an ohmic contact metal selected from the class of metals consisting of chromium, aluminum, and titanium located on said backside low resistance semiconductor region, and a solderable metal film selected from the class consisting of copper, chrome-copper, nickel and silver located on said selected ohmic contact metal.

15. A semiconductor device arrangement in accordance with claim 14, including a layer of gold located on said solderable metal film.

16. A semiconductor device arrangement in accordance with claim 14, wherein said ohmic contact metal being chromium and said solderable metal film being copper.

17. A semiconductor device arrangement in accordance with claim 14, wherein said ohmic contact metal being aluminum and said solderable metal film being composed of layers of chromium and copper.

18. A semiconductor device arrangement in accordance with claim 16, including a layer of gold located on said copper layer.

19. A semiconductor device arrangement in accordance with claim 17, including a layer of gold located on said copper layer.

20. A silicon semiconductor device arrangement comprising, in combination, a low resistance silicon substrate of one conductivity type having an impurity concentration of at least $10^{18}$ cm.$^{-3}$;

an epitaxial layer of the same conductivity type as said substrate located on said low resistance substrate;

at least one diffused region in said epitaxially grown layer;

a low resistance diffused region of the same conductivity type as said substrate located on the backside of said low resistance substrate;

ohmic metal contacts located on and in electrical contact with said epitaxial layer including said at least one diffused region therein; and, a solderable, ohmic metal contact system located on said backside low resistance diffused region, said solderable, ohmic metal contact system comprising an ohmic contact metal selected from the class of metals consisting of chromium, aluminum, and titanium located on said backside low resistance diffused region; and a solderable metal film selected from the class consisting of copper, chrome-copper, nickel, and silver located on said selected ohmic contact metal.

21. A semiconductor device arrangement in accordance with claim 20, wherein said ohmic contact metal being chromium and said solderable metal film being copper.

22. A semiconductor device arrangement in accordance with claim 21, including a layer of gold located on said copper film.

23. A semiconductor device arrangement in accordance with claim 20, wherein said ohmic contact metal being aluminum and said solderable metal film being composed of layers of chromium and copper.

24. A semiconductor device arrangement in accordance with claim 23, including a layer of gold in contact with said copper layer.

25. A module comprising, in combination, an insulating substrate;

a plurality of conductive metal lands located on a surface of said insulating substrate;

a solder film located on each of said conductive lands;

a semiconductor device arrangement backside mounted on one of said conductive lands, said semiconductor device arrangement comprising a semiconductor device having a low resistance semiconductor region having an impurity concentration of at least $10^{18}$ cm.$^{-3}$ located on the backside of said device and a solderable, ohmic metal contact system located on said backside low resistance semiconductor region, said solderable, ohmic metal contact system comprising an ohmic contact metal selected from the class of metals consisting of chromium, aluminum, and titanium located on said backside low resistance semiconductor region, and a solderable metal film selected from the class consisting of copper, chrome-copper, nickel, and silver located on said selected ohmic contact metal and in electrical and mechanical contact with said solder film located on said conductive land; and at least one conductive connector electrically connecting one of said conductive lands to a terminal contact located on the frontside surface of said semiconductor device, said terminal contact being in electrical contact with a semiconductor region of said semiconductor device.

References Cited

UNITED STATES PATENTS

| | | | |
|---|---|---|---|
| 3,241,931 | 3/1966 | Triggs et al. | 317—234 X |
| 3,268,309 | 8/1966 | Frank et al. | 29—195 |
| 3,367,806 | 2/1968 | Cullis | 317—234 X |
| 3,368,124 | 2/1968 | Ditrick | 317—235 |
| 3,370,207 | 2/1968 | Fabel et al. | 317—234 |
| 3,392,442 | 7/1968 | Napier et al. | 29—628 |
| 3,401,055 | 9/1968 | Langdon et al. | 317—234 X |

FOREIGN PATENTS

| | | |
|---|---|---|
| 1,023,531 | 3/1966 | Great Britain. |

JAMES D. KALLAM, Primary Examiner

R. F. POLISSACK, Assistant Examiner

U.S. Cl. X.R.

29—577, 589; 317—235